(12) United States Patent
Wang et al.

(10) Patent No.: US 11,398,391 B2
(45) Date of Patent: Jul. 26, 2022

(54) SUBSTRATE PROCESSING APPARATUS AND METHOD FOR PROCESSING SUBSTRATE

(71) Applicant: TAIWAN SEMICONDUCTOR MANUFACTURING COMPANY LTD., Hsinchu (TW)

(72) Inventors: Po-Yuan Wang, Hsinchu (TW); Tzu Ang Chiang, Yilan County (TW); Jian-Jou Lian, Tainan (TW); Yu Shih Wang, Tainan (TW); Chun-Neng Lin, Hsinchu County (TW); Ming-Hsi Yeh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 59 days.

(21) Appl. No.: 16/877,492

(22) Filed: May 19, 2020

(65) Prior Publication Data
US 2021/0366737 A1     Nov. 25, 2021

(51) Int. Cl.
*H01L 21/67*     (2006.01)
*H01L 21/683*     (2006.01)
*B08B 3/02*     (2006.01)

(52) U.S. Cl.
CPC ......... *H01L 21/67051* (2013.01); *B08B 3/02* (2013.01); *H01L 21/6708* (2013.01); *H01L 21/6715* (2013.01); *H01L 21/67115* (2013.01); *H01L 21/67248* (2013.01); *H01L 21/683* (2013.01)

(58) Field of Classification Search
CPC ............ H01L 21/683; H01L 21/67051; H01L 21/67115
See application file for complete search history.

(56) References Cited

U.S. PATENT DOCUMENTS

| 6,752,877 | B2* | 6/2004 | Ono | H01L 21/67051 |
|---|---|---|---|---|
| | | | | 134/26 |
| 2009/0075484 | A1* | 3/2009 | Song | H01L 21/6708 |
| | | | | 438/748 |
| 2014/0273498 | A1* | 9/2014 | Kobayashi | C23C 16/4584 |
| | | | | 438/745 |
| 2014/0331927 | A1* | 11/2014 | Nakano | H01L 21/68728 |
| | | | | 118/641 |

\* cited by examiner

*Primary Examiner* — Natasha N Campbell
(74) *Attorney, Agent, or Firm* — WPAT, P.C., Intellectual Property Attorneys; Anthony King (57) ABSTRACT

A substrate processing apparatus is provided. The substrate processing apparatus includes a plurality of holding members and at least a first injector. The plurality of holding members are configured to hold a substrate. The substrate includes a front surface and a back surface opposite to the front surface. The first injector is below the holding members and is configured to face the back surface of the substrate. The first injector is displaced from a projection of a center of the substrate from a top view perspective. A method for processing a substrate is also provided.

20 Claims, 11 Drawing Sheets

SUBSTRATE PROCESSING APPARATUS AND METHOD FOR PROCESSING SUBSTRATE

FIELD

The present disclosure relates to a substrate processing apparatus and a method for processing substrate, particularly, the disclosed apparatus can improve the uniformity of wafer during single wafer cleaning process at a high temperature.

BACKGROUND

New digital devices rely on the development of progressively faster, more powerful, smaller and lower cost semiconductors chips. However, as device features continue to shrink, smaller and smaller defects become critical defects which reduce yields and profits. These defects can originate from many sources, so chip fabrication must include many cleaning steps. With increasing chip complexities, each wafer can now require a large amount of cleaning steps during its manufacture, and advanced wafer cleaning systems have to be smarter than ever.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Due to the continued miniaturization of devices and increased complexity of processing, it is critical to ensure optimized, stable conditions during every cleaning process. Some critical factors, such as temperature variations, chemical solution concentrations, and chemical supply timing, can have a profound effect on particle removal performance and the cleanliness of the wafer's surface.

In some of substrate processing apparatus, including single wafer cleaners, single-wafer cleaning tools, etc., the cleaning approaches such as jet spraying or megasonic vibration may be utilized for the wafer cleaning process. To be more detailed, jet spray cleaning may shoot high-velocity water droplets at a wafer surface to remove defects, whereas megasonic cleaning may transmit acoustic waves (e.g., about 0.8-2 MHz) through a fluid bath to produce bubble oscillation to dislodge defects that were difficult to clean by jet spray. However, the bubbles may be collapsed quickly and generated energy that could damage smaller and more delicate chip features in megasonic cleaning, and these cleaning tools may not deliver energy uniformly across the wafer surface, which may result in inadequate and uneven cleaning.

Other than the cleaning function, the substrate processing apparatus may also provide multiple functions such as drying and wet etching processes. Regarding the circumstances that the energy delivered to the wafer surface is uneven, more negative effects may be induced thereby. For example, in the cases that a front surface of the substrate is etching by dispensing etchant thereon and meanwhile a back surface is cleaning by dispensing hot deionized (DI) water, the etching rate at the front surface of the substrate may be influenced by the hot deionized water dispensed at the back surface thereof. That is, the etching rates in different regions of the substrate may be significantly different. In other words, the etching uniformity of the front surface may be deteriorated because the energy delivered to the substrate from the hot deionized water is low in evenness.

Accordingly, some embodiments of the present disclosure provide a substrate processing apparatus and a method for processing substrate not only may improve the uniformity the etching regions at the front surface of the substrate, but also may thus control the etching profile in different regions of the substrate.

Figure 1:
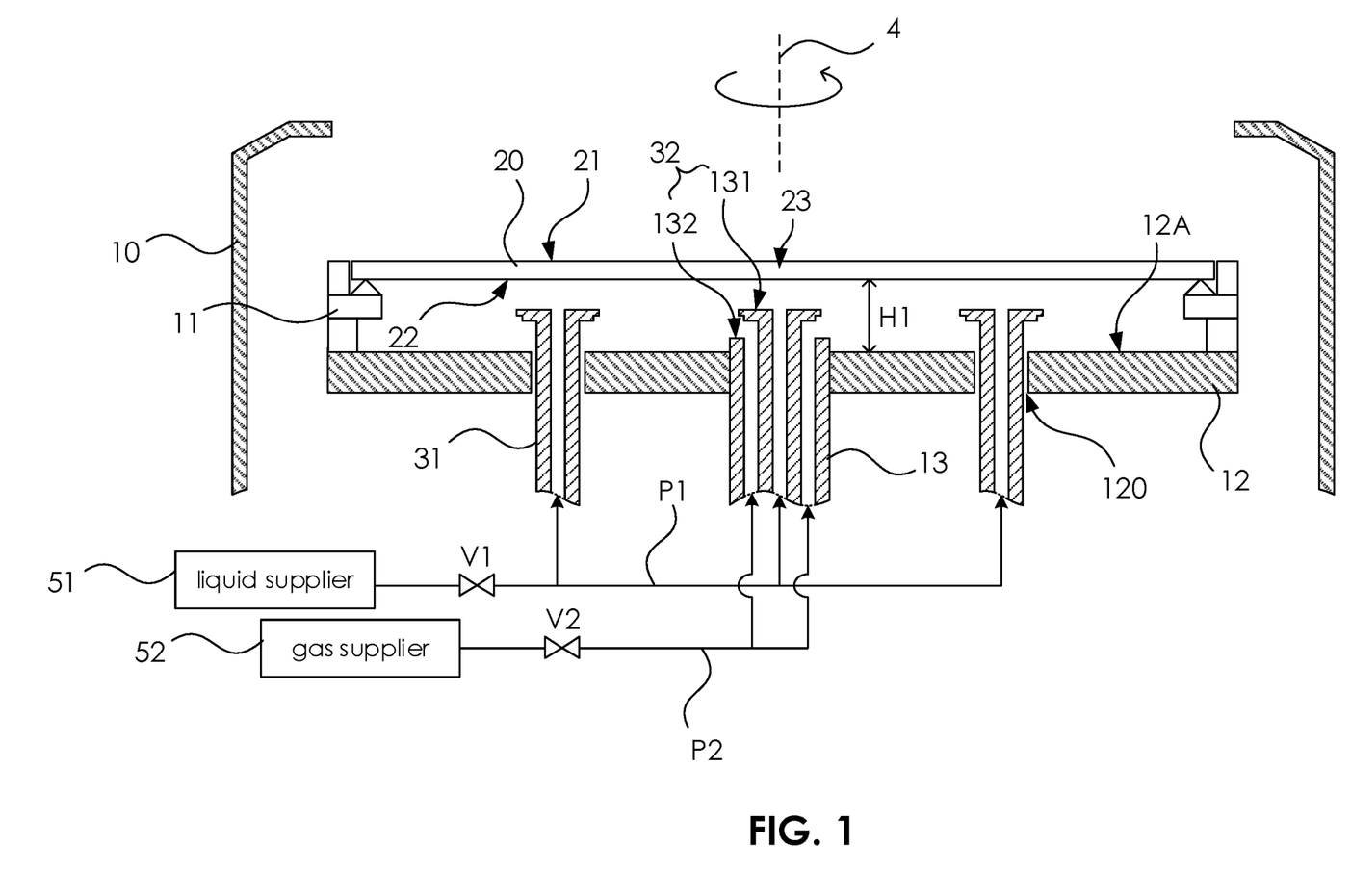
FIG. 1 illustrates a cross-sectional view of a substrate processing apparatus according to some embodiments of the present disclosure.

The substrate processing apparatus is utilized to process wafers on one by one basis, and the present disclosure uses semiconductor substrates such as wafers as an example described below. FIG. 1 illustrates the substrate processing apparatus according to some embodiments of the present disclosure. The substrate processing apparatus includes a plurality of holding members 11 and a least a first injector 31 in a processing chamber 10. The holding members 11 are configured to hold a substrate 20 horizontally in the processing chamber 10. The substrate 20 has a front surface 21 and a back surface 22 opposite to the front surface 21. The first injector 31 is disposed below the holding members 11 and configured to face the back surface 22 of the substrate 20. Some minor details of the processing chamber 10 are omitted for brevity.

In some embodiments, the substrate processing apparatus further including a rotating mechanism configured to rotate the substrate 20 with respect to a center axis 4 perpendicular to the front surface 21 thereof. In some embodiments, the rotation speed of the substrate 20 may in a range from about 10 rpm to about 1500 rpm.

Figure 2:
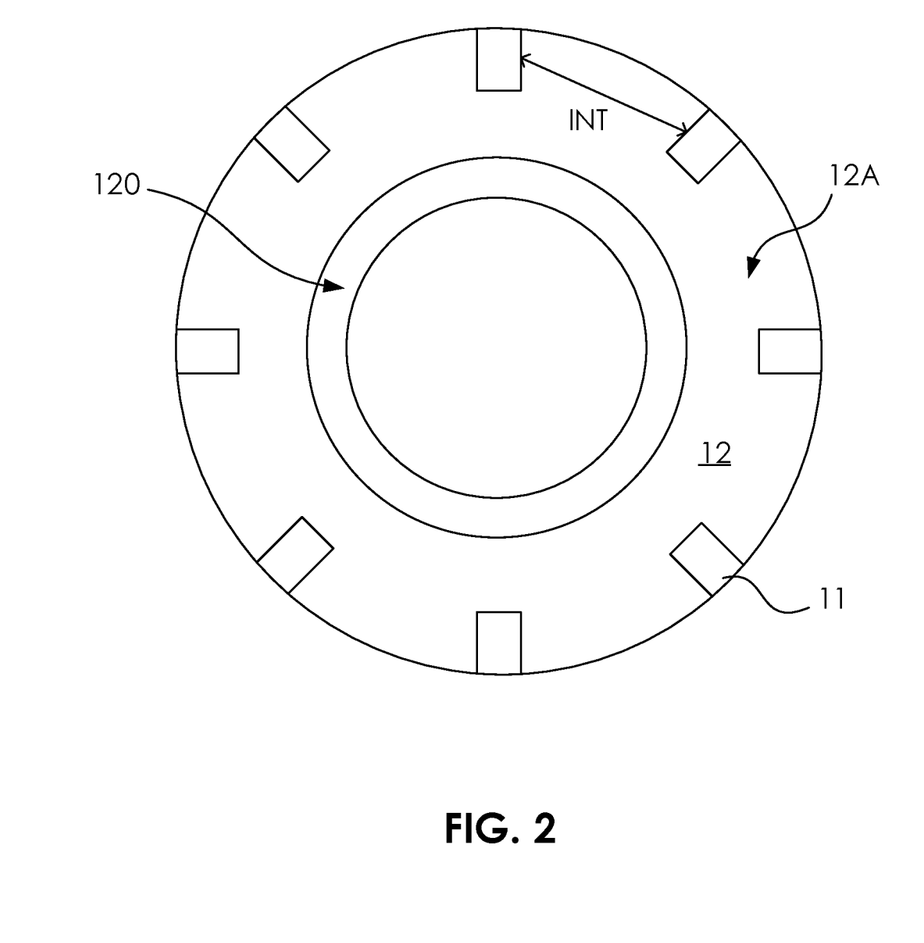
FIG. 2 illustrates a top view of a substrate processing apparatus according to some embodiments of the present disclosure.

For instance, a spin base 12 may be disposed below the holding members 11. The spin base 12 is rotatable around the center axis 4 perpendiculars to the spin base 12 and the front surface 21 of the substrate 20 thereon. As shown in FIG. 2, in some embodiment, the plurality of the holding members 11 are disposed on the spin base 12 with even intervals INT in a circumferential direction of an upper surface 12A of the spin base 12 and in proximity to an edge of the spin base 12. The spin base 12 further includes at least a ring opening 120 for rotating relative to the fixed injectors. Back to refer FIG. 1, the plurality of the holding members 11 may hold the substrate 20 horizontally at a substrate holding height H1 that spaced at a predetermined interval from the upper surface 12A of the spin base 12.

In some embodiments, the rotating mechanism may further include a rotation shaft 13 extending vertically downwardly from the spin base 12. The spin base 12 and the rotation shaft 13 are driven by a drive mechanism (not shown in the figure) coupled to the rotation shaft 13 and thereby the rotation shaft 13, the spin base 12, the holding members 11, and the substrate 20 hold by the holding members 11 over the spin base 12 may be rotated around the center axis 4 as aforementioned.

In some embodiments, the rotation shaft 13 may include a first basic injector 131 inside. That is, the rotation shaft 13 may be a cylindrical hollow shaft, and a processing liquid may be supplied from a pipe P1 coupled to the rotation shaft 13 to the back surface 22 of the substrate 20 through the first basic injector 131. In some embodiments, the rotation shaft 13 may further include a second basic injector 132 inside adjacent to the first basic injector 131. A processing gas may be supplied from another pipe P2 coupled to the rotation shaft 13 to the back surface 22 of the substrate 20 through the second basic injector 132. In some embodiments, an end of each of the first basic injector 131 and the second basic injector 132 may include a nozzle (not shown in the figure) to direct the processing liquid and the processing gas in a particular way. In some embodiments, the processing liquid and the processing gas are directed to the back surface 22 of the substrate 20 perpendicularly. In some embodiments, the first basic injector 131 is laterally surrounded by the second basic injector 132. In some embodiments, the pipes P1, P2 may include valves V1, V2 respectively for controlling the flow of the processing liquid and the processing gas.

In some embodiments, the processing gas may include inert gas such as krypton (Kr) and argon (Ar). In some embodiments, the processing gas may include nitrogen gas ($N_2$). In some embodiments, the processing liquid may include deionized water.

The substrate processing apparatus in the present disclosure may include at least one first injector 31 below the holding members other than the first basic injector 131 and the second basic injector 132. In some embodiments, the first injector 31 is displaced from a projection of a center 23 of the substrate 20 from a top view perspective, whereas a second injector (set) 32, including the first basic injector 131 and the second basic injector 132 as aforementioned, is at a projection of the center 23 of the substrate 20 from a top view perspective.

Figure 3:
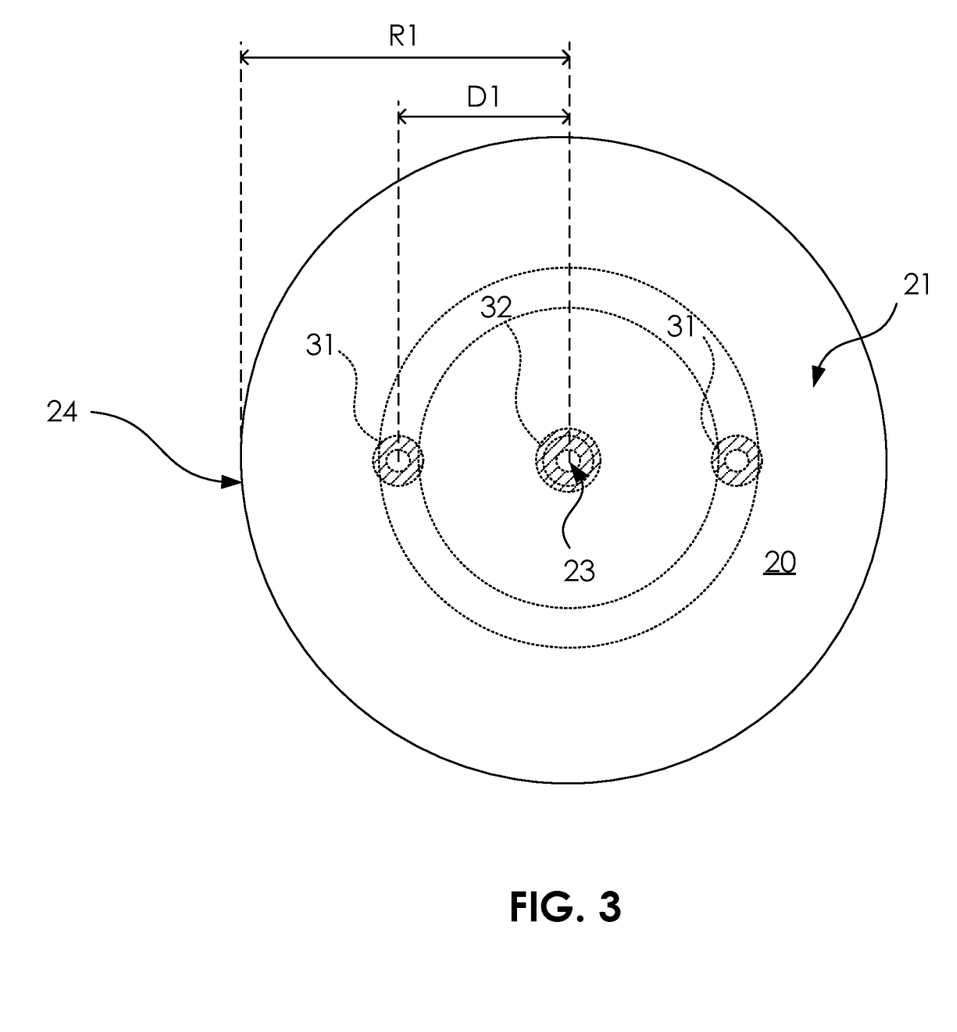
FIG. 3 illustrates a top view of a substrate according to some embodiments of the present disclosure.

In other words, the first injector 31 is different to the first and second basic injectors 131, 132 in the rotation shaft 13 due to the positions thereof. As shown in FIG. 3, in some embodiments, the first injector 31 and the second injector 32 are arranged along a projection of a diameter of the substrate 20 from a top view perspective. In some embodiments, the first injector 31 is positioned at a middle point of the center 23 and an edge 24 of the substrate 20 from a top view perspective. In some embodiments, a ratio of a distance D1 between the first injector 31 and the second injector 32 and a radius R1 of the substrate 20 is in a range of from about 0.3:1 to about 0.7:1. Accordingly, the first injector 31 may occupy the space below the substrate 20 between the rotation shaft 13 and the edge of the spin base 12.

Figure 4:
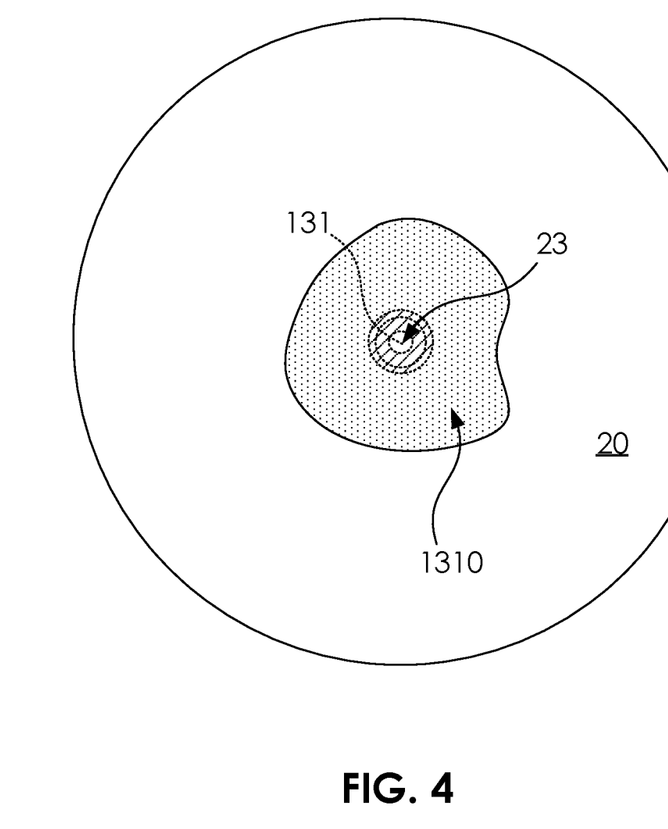
FIG. 4 illustrates a top view of a substrate according to some embodiments of the present disclosure.

Under the circumstances that the processing liquid (e.g., hot deionized water) injected from the first basic injector 131 is utilized to heat the substrate 20 from the back side thereof, the processing liquid may contact the back surface 22 of the substrate 20 and transfer the heat to the main body of the substrate 20. Accordingly, the temperature at the front surface 21 of the substrate 20 may be increased to a predetermined level for subsequent etching process. Because the first basic injector 131 is positioned below the center 23 of the substrate 20 from a top view perspective, as shown in FIG. 4, it may generate a single temperature zone 1310 at the center 23 of the substrate 20, such single temperature zone may present as a hot spot and induce the center 23 of the substrate 20 having a higher temperature than the peripheral edge portion thereof. To further improve the temperature uniformity across the substrate 20 in FIG. 4, as will be described in FIG. 6A of the present disclosure, an infrared (IR) heater facing the back surface of the substrate 20 may be implemented to control the temperature at the peripheral edge portion of the substrate, in addition to using the first basic injector 131. For example, the IR heater may be deviced to aim at the peripheral edge portion of the substrate.

To be more detailed, when the processing liquid injected to the back surface 22 of the substrate 20 is heated to a high temperature, the processing liquid is at the high temperature immediately after being supplied to the back surface 22 of the substrate 20. However, the liquid temperature lowers while flowing to the peripheral edge portion of the substrate 20. Therefore, the temperature of the processing liquid is relatively high in the center 23 of the substrate 20, and the temperature of the processing liquid is relatively low in the peripheral edge portion of the substrate 20. As a result, uneven etching rates on the front surface 21 of the substrate 20 may be caused. For example, in such a manner that a center of the front surface 21 of the substrate 20 is treated by an etchant speedily while the peripheral edge portion of the front surface 21 of the substrate 20 is treated by the etchant relatively slowly. In some embodiments, the etchant may include HF (hydrogen fluoride), TMAH (tetramethylammonium hydroxide), SC1 (ammonia-hydrogen peroxide mixture), etc.

The etching profile at the front surface 21 of the substrate 20 may be influenced by the temperature of etching process, and therefore in such circumstances, the uniformity values of 2 sigma of the front surface 21 after etching may be poor, for instance, over 30% approximately. Accordingly, some embodiments of the present disclosure utilize the first injector 31 as an additional heat source for providing heat to the back surface 22 of the substrate 20.

Figure 5:
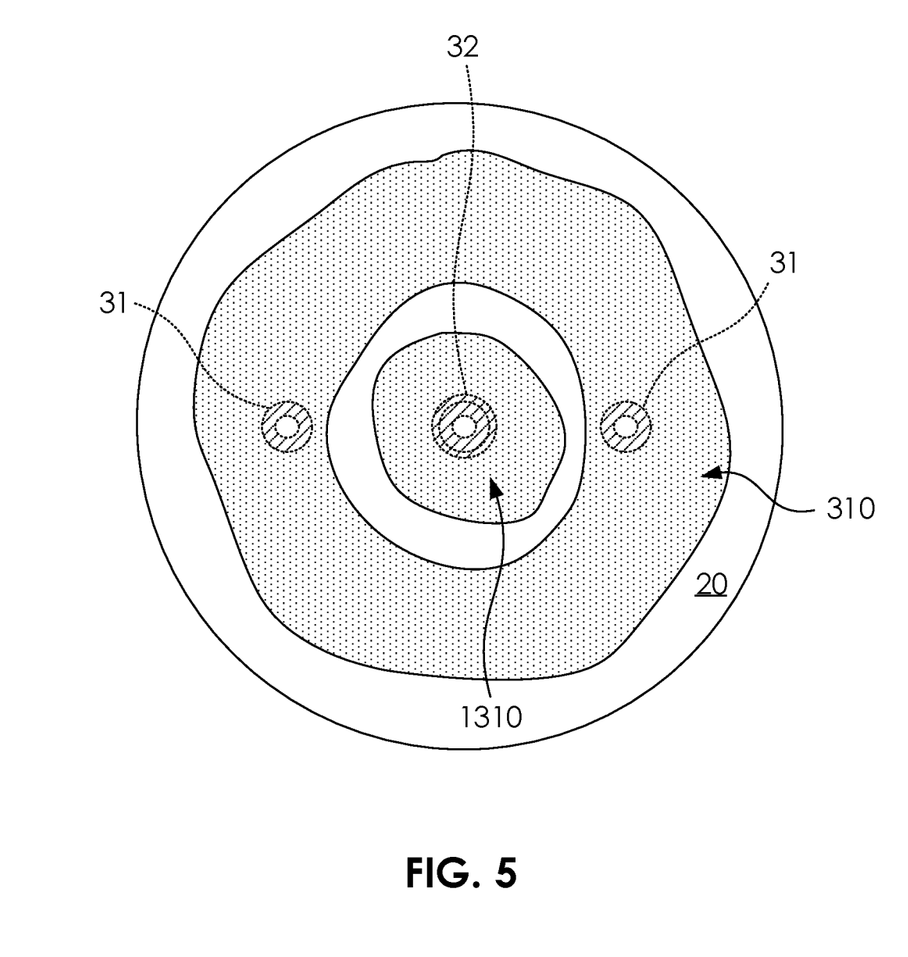
FIG. 5 illustrates a top view of a substrate according to some embodiments of the present disclosure.

Because the substrate 20 may be rotated by the spin base 12 during etching process, in some embodiments, as shown in FIG. 5, the first injector 31 and the second injector 32 (or the first basic injector 131) may thus produce two concentric temperature zones 1310, 310 on the substrate 20. In some embodiments, the first injector 31 may provide processing liquid like the first basic injector 131 does. In some embodiments, the first injector 31 is coupled to at least one of a liquid supplier 51 and a gas supplier 52 (referring to previously shown FIG. 1), depends on the demands for single wafer processing.

Figure 6A:
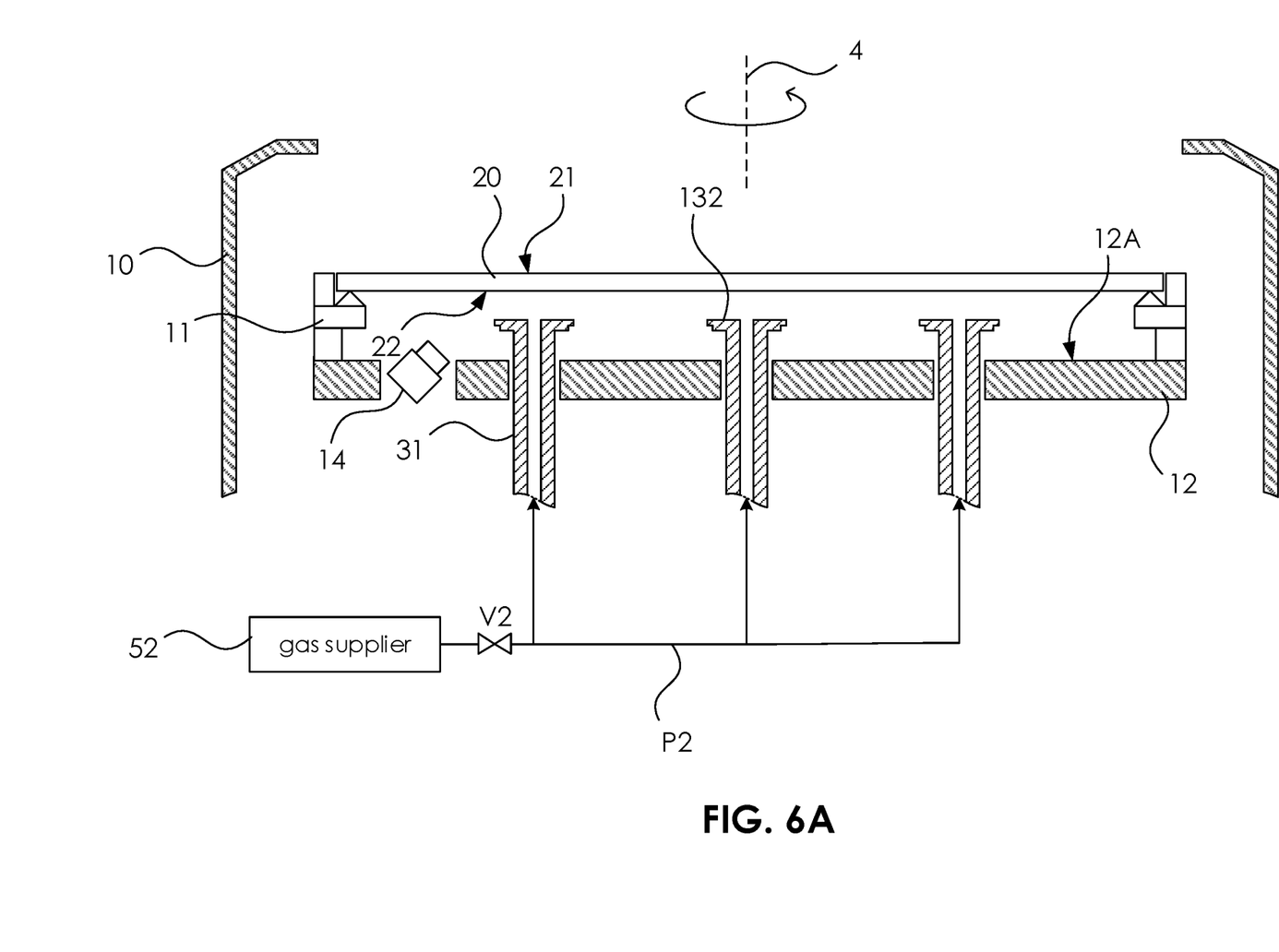
FIG. 6A illustrates a cross-sectional view of a substrate processing apparatus according to some embodiments of the present disclosure.
Figure 6B:
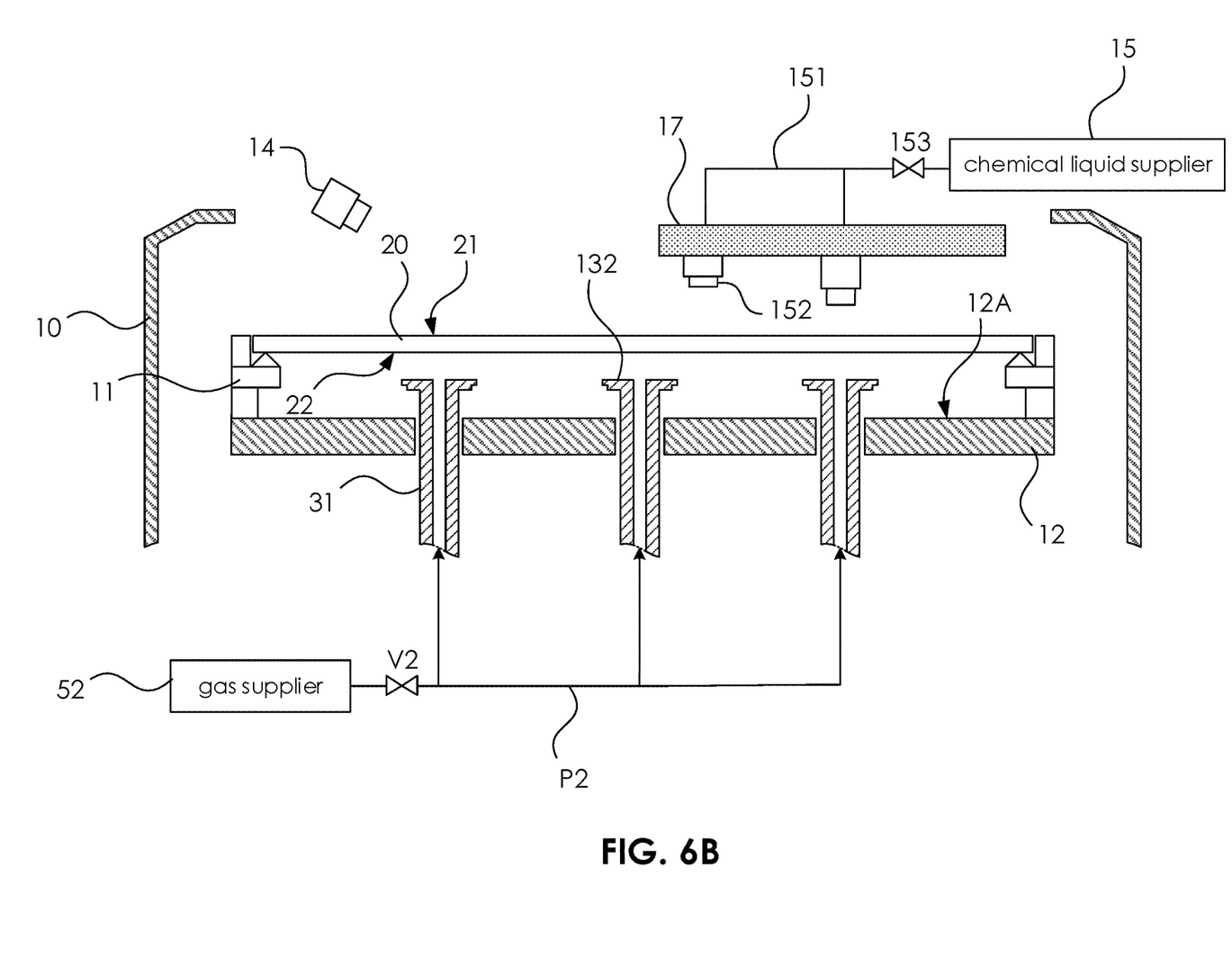
FIG. 6B illustrates a cross-sectional view of a substrate processing apparatus according to some embodiments of the present disclosure

In consider the processing gas (e.g., inert gas or nitrogen gas) may not provide enough heat to the substrate 20 to increase the temperature thereof, in some embodiments, as shown in FIG. 6A, the substrate processing apparatus may further includes an infrared (IR) heater 14 facing the back surface 22 of the substrate 20. The infrared heater 14 may transfer energy to the substrate 20 through electromagnetic radiation. Because the functions of heating and gas providing are divided in such embodiments, the infrared heater 14 may be disposed with in the processing chamber without integrated with the first injector 31. Accordingly, in some embodiments, as shown in FIG. 6B, the infrared heater 14 may be disposed over the substrate 20 and thus facing the front surface 21 of the substrate 20. Furthermore, in such embodiments, the second injector may only include the second basic injector 132 for injecting gas without accompany with the first basic injector as previously shown in FIG. 1. Likewise, the liquid supplier and the pipes for providing the processing liquid may be waived, whereas the gas supplier 52 is connected to each of the first injectors 31 in such embodiments.

During the single wafer processing, the substrate 20 is etched by dispensing etchant at the front surface 21 of the substrate 20. In some embodiments, a working arm 17 connected to a chemical liquid supply mechanism may be arranged above the substrate 20. The chemical liquid supply mechanism may include a chemical liquid supplier 15, a supply pipe 151 and at least a supply nozzle 152 below the working arm 17 and facing the front surface 21 of the substrate 20. In some embodiments, the position of the supply nozzle 152 may be moved by the working arm 17. The chemical liquid may be transported from the chemical liquid supplier 15 to the supply nozzle 152 through the supply pipe 151, and the chemical liquid is discharged from the supply nozzle 152 to the front surface 21 of the substrate 20 there below. In some embodiments, the chemical liquid supply mechanism may further include a chemical liquid valve 153 interposed in the supply pipe 151. The open and the close of the chemical liquid valve 153 may switch the supplying of the chemical liquid (e.g., the etchant) to the substrate 20.

As aforementioned, the etching profile at the front surface 21 of the substrate 20 may be influenced by the temperature of etching process, in fact, the substrate 20 may need to be heated to a predetermined temperature prior to the operation of etching in some embodiments. Moreover, the predetermined temperature of the substrate 20 may not be increased by the chemical liquids supplied by the chemical liquid supply mechanism over the substrate 20 dependently. Accordingly, the present disclosure heats the substrate 20 from its back side by the first injector 31 and the second injector 32 as shown in previous embodiments.

Except for the heat providing of the first injector 31 and the second injector 32, there is at least another function may be provided by the injectors below the substrate 20. In some embodiments, the processing fluid or the processing gas injected from the first injector 31 and the second injector 32 may cover the back surface 22 of the substrate 20. Such coverage crosses the entire back surface 22 of the substrate 20 to prevent the chemical liquid dispensed on the front surface 21 from being contaminating the back surface 22.

In some embodiments, the chemical liquid supply unit 15 may provide chemical liquid to the substrate 20 there below for cleaning instead of etching. For example, a material layer has been already formed on the substrate 20 which includes conductive materials (such as polysilicon, polysilicon metal, copper, aluminum, or other metals) and dielectric materials (such as silicon oxide, silicon nitride, etc.). The method of forming the material layer may include a sputtering method, a chemical vapor deposition method, an epitaxy method, and the like. Therefore, many particles may be attached to the front surface 21 of the substrate 20 during the formation process of the material layer.

In such embodiments, deionized water may be supplied to the front surface 21 of the substrate 20 to perform a scrubbing process to remove particles thereon. In some embodiments, a brush arm may be used to move a bush head on the substrate 20, and the chemical liquid supply unit 15 may supply the deionized water to the front surface 21 of the substrate 20 for cleaning. In such embodiments, the first injector 31 and the second injector 32 may be waived from injecting the processing liquid (i.e., the deionized water) to the back surface 22 of the substrate 20 because the deionized water splashes back may not contaminate or damage the profile of the back surface 22. However, the processing gas may be injected to the back surface 22 to remove water marks or water spots thereon and prevent the forming of weak acids from the reaction between the oxygen ($O_2$) in the air and the deionized water.

Figure 7:
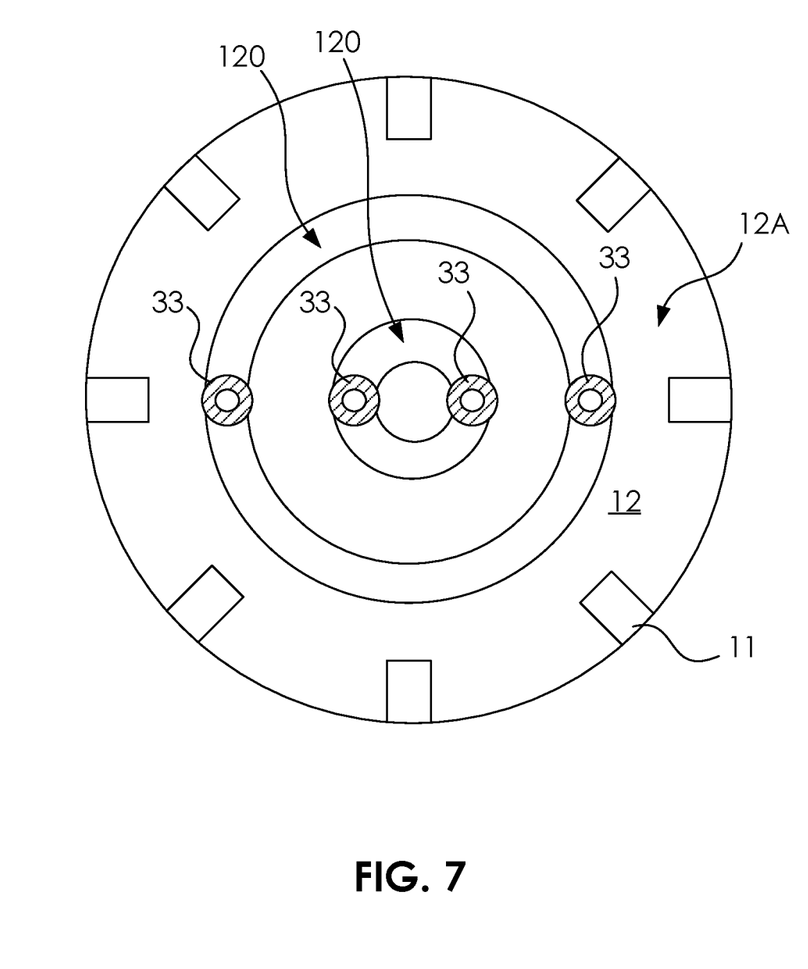
FIG. 7 illustrates a top view of a substrate processing apparatus according to some embodiments of the present disclosure.

As shown in FIG. 7, in some embodiments, the substrate processing apparatus may include a plurality of holding members 11 and a plurality of injectors 33, wherein the plurality of injectors 33 are distributed evenly along a projection of a diameter of the substrate 20 from a top view perspective. In some embodiments, the center of the spin base 12 may be waived from disposing injector, accordingly, the rotation shaft may not be integrated with the pipes and the injectors in such embodiments.

Figure 8:
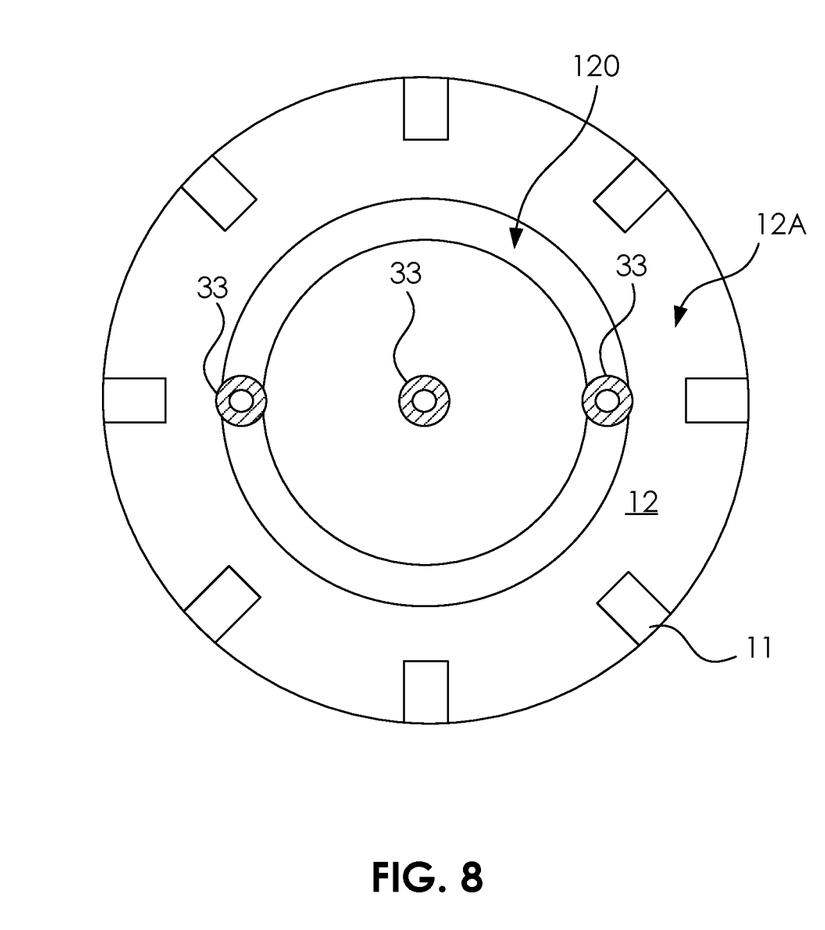
FIG. 8 illustrates a top view of a substrate processing apparatus according to some embodiments of the present disclosure.

In some embodiments, the amount of processing liquid for heating the substrate by each of the plurality of injectors 33 may be different. For example, the stream of the processing liquid injected from the injector 33 at the center of the substrate from a top view perspective may be greater than that of other injectors 33, because the arrangement of the injectors 33 other than the center one may be symmetric, as shown in FIG. 8. To be more detailed, each of the concentric temperature zones produced by the injectors 33 may be generated by two injectors 33 due to the rotation of the substrate, and therefore the injectors 33 other than the center one may provide less heat in avoid of the temperature of the substrate 20 at the outer concentric temperature zones greater than that at the center 23 of the substrate 20.

Figure 9:
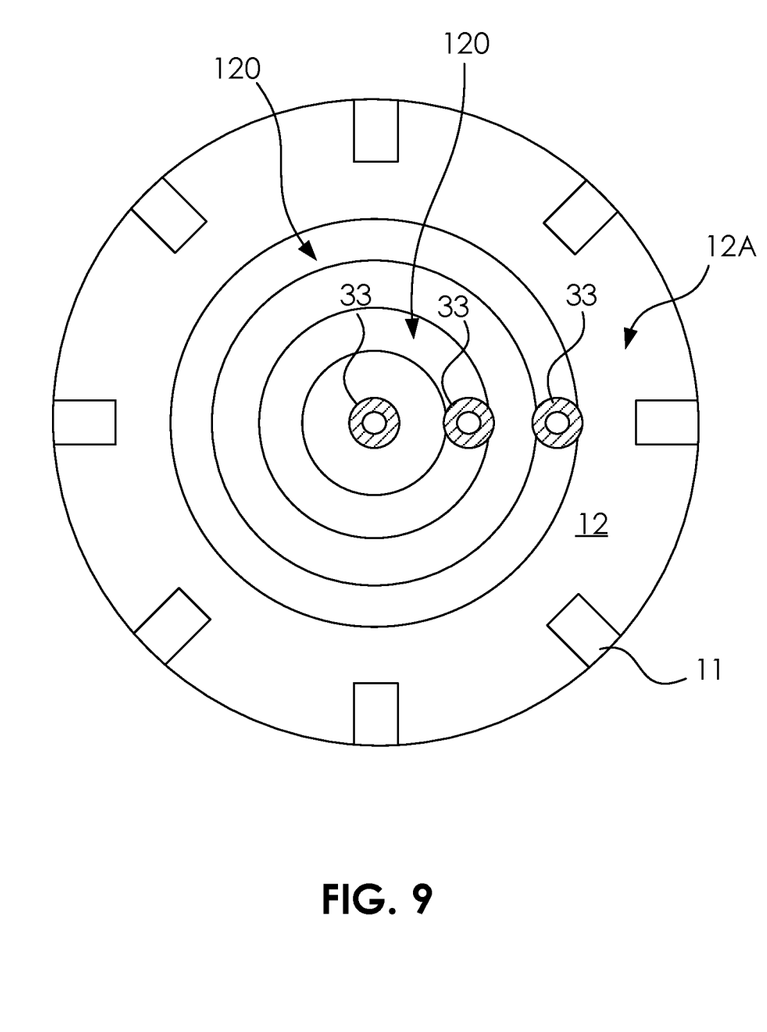
FIG. 9 illustrates a top view of a substrate processing apparatus according to some embodiments of the present disclosure.

In some embodiments, as shown in FIG. 9, the injectors 33 may be disposed along the radius of the spin base 12 only, because the substrate may be rotated during the heating process, therefore the injectors 33 may not be disposed evenly along the diameter of the spin base 12.

By positioning a plurality of injectors 33 below the substrate 20, in some embodiments, the present disclosure may provide versatile etching profile by controlling the stream of the processing liquid at the back surface 22 of the substrate 20. That is, the hot deionized water injected from different injectors 33 may increase the temperature of the corresponding regions of the substrate 20, and therefore the etching rate in selected regions of the substrate 20 may be accelerated by increasing the stream of the hot deionized water there below, and the etching profile of the substrate 20 may be controlled accordingly. In such embodiments, the substrate processing apparatus may include a controller (not shown in the figure) coupled to the injectors 33, and the controllers may be utilized to control the temperature of the fluid injected from each of the injectors 33 independently.

Figure 10:
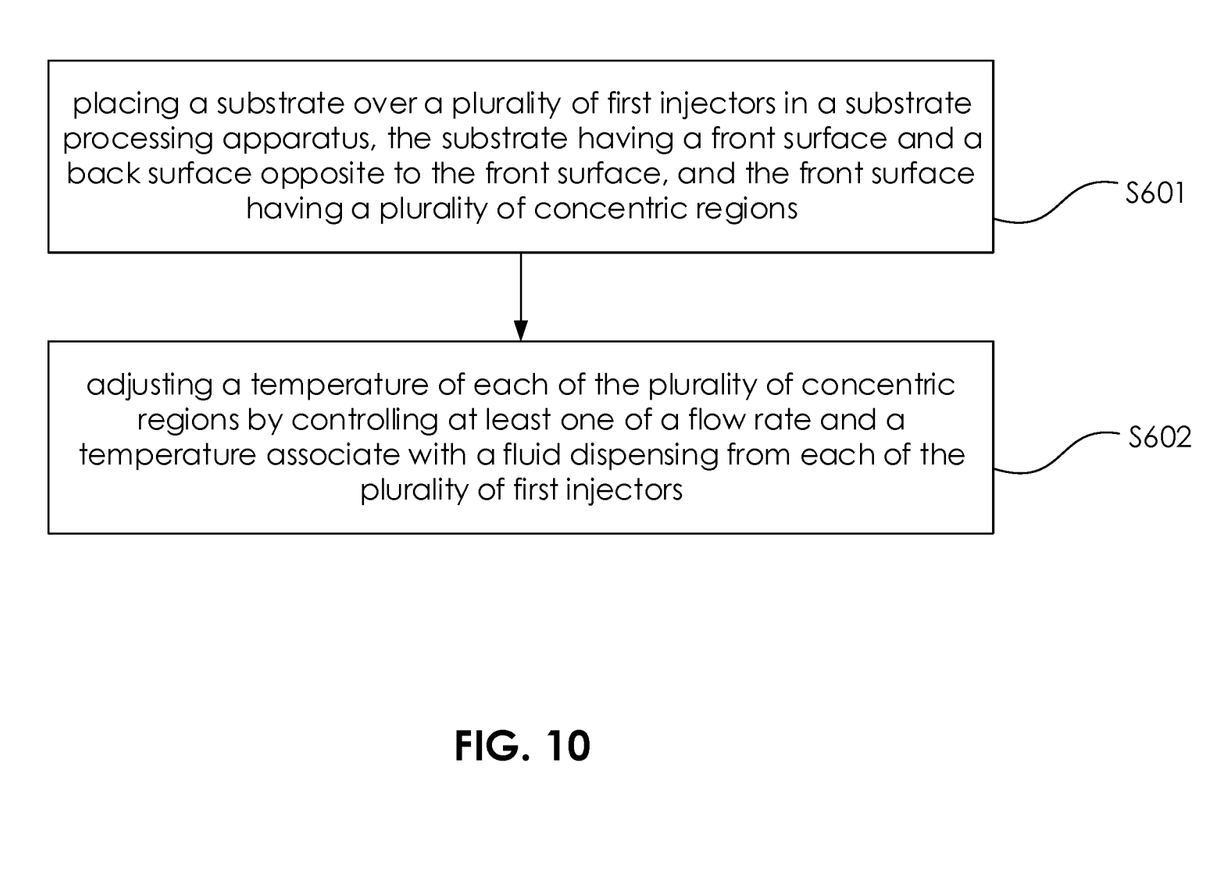
FIG. 10 illustrates a flow chart of a method for processing substrate according to some embodiments of the present disclosure.

FIG. 10 illustrates a flow chart of processing a substrate according to some embodiments of the present disclosure. In such embodiments, the measurement includes an operation 601: placing a substrate over a plurality of first injectors in a substrate processing apparatus, the substrate having a front surface and a back surface opposite to the front surface, and the front surface having a plurality of concentric regions; and an operation 602: adjusting a temperature of each of the plurality of concentric regions by controlling at least one of a flow rate and a temperature associated with a fluid dispensing from each of the plurality of first injectors. In such embodiments, the plurality of first injectors are displaced from a projection of a center of the substrate from a top view perspective.

In performing the operations 601 and 602, the substrate processing apparatus disclosed in previous figures may be utilized, and the repeated descriptions of the features and functions of the substrate processing apparatus are omitted here for brevity.

As aforementioned, the substrate processing apparatus may include the spin base 12 and the rotation shaft 13, therefore in some embodiments, in order to increase the temperature of the substrate 20 quickly and evenly by the injectors there below, the method of processing the substrate may further includes the operation that rotating the substrate 20 with respect to a center axis perpendicular to the front surface 21 thereof when adjusting the temperature, therefore a plurality of concentric temperature zones may be performed in the substrate 20, and the etching rate of the substrate 20 in different regions or zones may be aligned to have consistency. For example, the uniformity values of 2 sigma of the front surface 21 after etching may be enhanced to, less than 10% approximately.

The approach in heating the substrate 20 in the present disclosure may be various. As previously shown in FIGS. 1 and 6A, the substrate 20 may be heated by liquids (e.g., hot deionized water) or non-contact heaters (e.g., infrared heater). In the circumstances that using hot liquids as heaters, the method of processing the substrate may further includes the operations that injecting a liquid of a predetermined and controlled temperature from the first injectors to cover the back surface of the substrate, and then dispensing etchant at the front surface of the substrate subsequent to injecting the liquid.

In other circumstances that using non-contact heaters such as infrared heaters, the method of processing the substrate may further includes the operations that injecting a gas from the first injectors to cover the back surface of the substrate and altering a temperature of the substrate by an infrared heater, and then dispensing etchant at the front surface of the substrate subsequent to injecting the gas and altering the temperature of the substrate. In other words, the flow for cover the back surface in preventing the splashed etchant may be separated from the heaters in some of embodiments of the present disclosure.

According to the present disclosure, a substrate processing apparatus and a method for processing substrate are disclosed. The substrate processing apparatus may include at least one injector which injects hot deionized water to a region of the back surface of the substrate other than to the center thereof. As a result, the substrate is heated evenly and the contaminant from the wet etching process at the front surface of the substrate may also be avoided thereby. In some embodiments of the present disclosure, the flows of the hot deionized water in different regions of the substrate may be controlled, for instance, the flow rate is altered among the injectors or the valves are switched respectively. Consequently, the uniformity of the substrate after processing may become better, and a novel approach in controlling the etching profile in different regions of the substrate may be achieved.

In one exemplary aspect, a substrate processing apparatus is provided. The substrate processing apparatus includes a plurality of holding members and at least a first injector. The plurality of holding members are configured to hold a substrate. The substrate includes a front surface and a back surface opposite to the front surface. The first injector is below the holding members and is configured to face the back surface of the substrate. The first injector is displaced from a projection of a center of the substrate from a top view perspective.

In another exemplary aspect, a substrate processing apparatus is provided. The substrate processing apparatus includes a plurality of holding members and a plurality of injectors. The plurality of holding members are configured to hold a substrate. The substrate includes a front surface and a back surface opposite to the front surface. The plurality of injectors are below the holding members and are configured to face the back surface of the substrate. The plurality of injectors are distributed evenly along a projection of a diameter of the substrate from a top view perspective In yet another exemplary aspect, a method for processing a substrate is provided. The method includes the operations as follows. A substrate is placed over a plurality of first injectors in a substrate processing apparatus, the substrate having a front surface and a back surface opposite to the front surface, and the front surface having a plurality of concentric regions. A temperature of each of the plurality of concentric regions is adjusted by controlling at least one of a flow rate and a temperature associated with a fluid dispensing from each of the plurality of first injectors. The plurality of first injectors are displaced from a projection of a center of the substrate from a top view perspective.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A substrate processing apparatus, comprising:
   a plurality of holding members configured to hold a substrate, the substrate having a front surface and a back surface opposite to the front surface;
   at least a first injector below the holding members and configured to face the back surface of the substrate; and
   a spin base disposed below the plurality of holding members, wherein the spin base comprises a ring opening for rotating relative to the first injector;
   wherein the first injector is displaced from a projection of a center of the substrate from a top view perspective.

2. The substrate processing apparatus of claim 1, further comprising a second injector at a projection of the center of the substrate from a top view perspective.

3. The substrate processing apparatus of claim 2, wherein the first injector and the second injector are arranged along a projection of a diameter of the substrate from a top view perspective.

4. The substrate processing apparatus of claim 2, wherein a stream of processing liquid injected from the second injector is greater than that of the first injector.

5. The substrate processing apparatus of claim 1, wherein a ratio between a distance between the first injector and the second injector and a radius of the substrate is in a range of from about 0.3:1 to about 0.7:1.

6. The substrate processing apparatus of claim 1, further comprising a rotating mechanism configured to rotate the substrate with respect to a center axis perpendicular to the front surface thereof.

7. The substrate processing apparatus of claim 1, wherein the first injector is coupled to at least one of a gas supplier and a liquid supplier.

8. The substrate processing apparatus of claim 7, wherein the gas supplier provides nitrogen gas to the back surface of the substrate through the first injector.

9. The substrate processing apparatus of claim 8, further comprises an infrared heater facing at least one of the front surface and the back surface of the substrate.

10. The substrate processing apparatus of claim 7, wherein the liquid supplier provides deionized water of a predetermined and controlled temperature to the back surface of the substrate through the first injector.

11. A substrate processing apparatus, comprising:
    a plurality of holding members configured to hold a substrate, the substrate having a front surface and a back surface opposite to the front surface;
    a plurality of injectors below the holding members and configured to face the back surface of the substrate; and
    a spin base disposed below the plurality of holding members, wherein the spin base comprises a plurality of ring openings for rotating relative to the plurality of injectors;
    wherein the plurality of injectors are distributed evenly along a projection of a radius of the substrate from a top view perspective.

12. The substrate processing apparatus of claim 11, wherein the injectors are coupled to a fluid supplier configured to provide a fluid at a predetermined and controlled temperature covering the back surface of the substrate.

13. The substrate processing apparatus of claim 12, further comprising a controller coupled to the injectors configured to control the temperature of the fluid injected from each of the injectors independently.

14. The substrate processing apparatus of claim 11, wherein the injectors are coupled to a gas supplier configured to provide gas covering the back surface of the substrate.

15. The substrate processing apparatus of claim 14, further comprising a contactless heater facing at least one of the front surface and the back surface of the substrate.

16. The substrate processing apparatus of claim 11, wherein the plurality of injectors are free from being distributed at a center of the substrate from a top view perspective.

17. A substrate processing apparatus, comprising:
    a plurality of holding members configured to hold a substrate, the substrate having a front surface and a back surface opposite to the front surface;
    a plurality of injectors below the holding members and configured to face the back surface of the substrate; and
    a spin base disposed below the plurality of holding members, wherein the spin base comprises a plurality of ring openings for rotating relative to the plurality of injectors;
    wherein the plurality of injectors are distributed evenly along a projection of a diameter of the substrate from a top view perspective.

18. The substrate processing apparatus of claim 17, wherein a center of the spin base is waived from disposing the plurality of injectors.

19. The substrate processing apparatus of claim 17, wherein each of the plurality of injectors is coupled to a liquid supplier to provide deionized water of a predetermined and controlled temperature to the back surface of the substrate.

20. The substrate processing apparatus of claim 17, wherein one of the plurality of injectors is at a center of the substrate from a top view perspective.

* * * * *